May 13, 1969 B. W. MATTHEWS 3,444,502

MEANS FOR MAKING AN ELECTRICAL CONNECTION BETWEEN AN ELECTRICAL COMPONENT AND A PRINTED CIRCUIT

Filed Dec. 22, 1966

United States Patent Office 3,444,502

Patented May 13, 1969

3,444,502

MEANS FOR MAKING AN ELECTRICAL CONNECTION BETWEEN AN ELECTRICAL COMPONENT AND A PRINTED CIRCUIT

Benjamin William Matthews, Birmingham, England, assignor to Joseph Lucas (Industries) Limited, Birmingham, England

Filed Dec. 22, 1966, Ser. No. 604,005

Claims priority, application Great Britain, Jan. 26, 1966, 3,442/66

Int. Cl. H05k *1/00;* H01v *3/00;* H01h *85/20*

U.S. Cl. 339—17 1 Claim

ABSTRACT OF THE DISCLOSURE

Means for making an electrical connection between an electrical component and a printed circuit board comprises a resilient contact which extends from the body of the component so that when the component is secured in position relative to the printed circuit the contact makes contact with an exposed portion of the printed circuit. The body of the component is provided with a resilient catch with which the resilient contact can be engaged to lock the resilient contact in a stressed position in engagement with the printed circuit.

This invention relates to means for making an electrical connection between an electrical component and a printed circuit.

Means in accordance with the invention comprises a resilient contact extending from said component so that when the component is secured in position relative to the printed circuit, the contact will make contact with an exposed portion of the printed circuit and will be stressed, and a catch on the electrical component with which the resilient contact can be engaged to lock the resilient contact in the stressed position.

Figure 1:
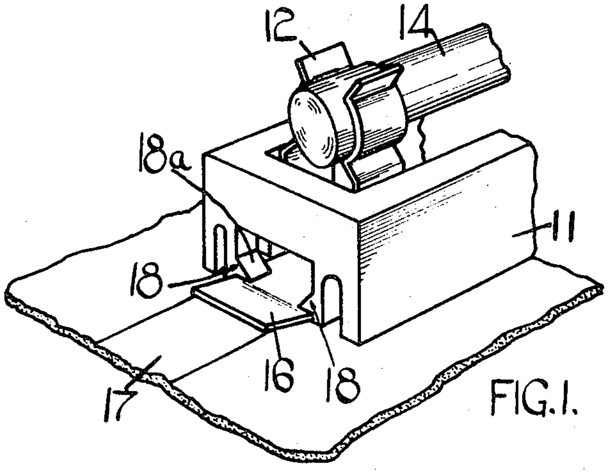
Figure 2:
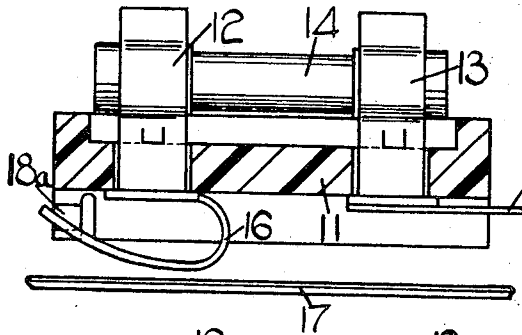
Figure 3:
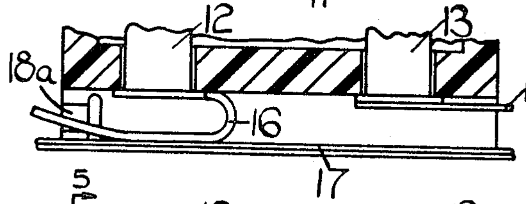
Figure 4:
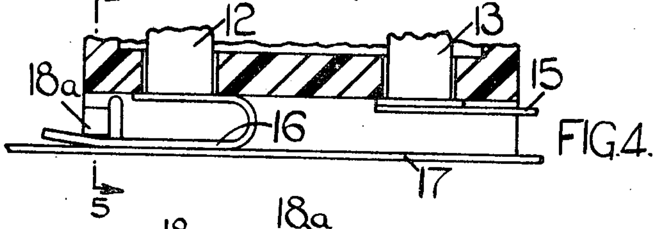
Figure 5:
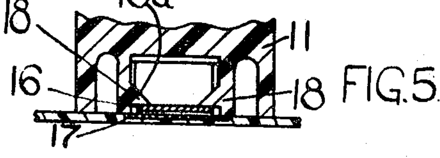

One example of the invention is illustrated in the accompanying drawings wherein, FIGURE 1 is a fragmentary perspective view of a fuse holder, FIGURES 2, 3 and 4 are sectional side views respectively of the fuse holder shown in FIGURE 1 during three stages of its connection to a printed circuit and FIGURE 5 is a sectional view on the line 5—5 in FIGURE 4.

Referring to the drawing, the fuse holder includes a moulded body 11 with which are engaged a pair of contact members 12, 13 shaped to receive a fuse 14 therebetween. The contact member 13 has secured thereto a contact 15 which may for example form the plug member of a plug and socket member to provide one connection to the fuse holder, and in use the connection to the contact member 12 is made by way of a flexible printed circuit. For this purpose the contact member 12 has secured thereto a resilient contact 16, which as shown in FIGURE 2 is bowed. The body 11 is secured by screws (not shown) to a part on which the flexible printed circuit 17 rests, and the arrangement is such that when the body 11 is secured in position, the contact 16 will be stressed as indicated in FIGURE 3, and will therefore make a good contact with an exposed portion of the printed circuit 17.

Integrally formed on the body 11 are a pair of resilient catches 18 each of which has an inclined surface 18*a* along which the contact 16 can ride when it is pressed downwardly, the catches 18 flexing to allow the contact 16 to engage behind the inclined surface thereby locking the resilient contact 16 in the pressed position.

It will be appreciated that although the example described is used in conjunction with a flexible printed circuit, the invention is equally applicable to printed circuit boards.

Having thus described my invention what I claim as new and desire to secure by Letters Patent is:

1. Means for making an electrical connection between an electrical component having an insulating body, and a printed circuit comprising a resilient strip like contact secured to and extending from the body of said component so that when the component is secured in position relative to the printed circuit, the contact will make facial contact with an exposed portion of the printed circuit, and a resilient leg on the body of the electrical component, said leg having a cam surface thereon which is engageable by the contact during manual movement of the contact towards the printed circuit to stress the contact against the printed circuit, said cam surface flexing said leg from its original position during said movement of the contact, to allow the contact to move towards the printed circuit and thereafter allow the leg to return to its original position to lock the resilient contact in the stressed position.

References Cited

UNITED STATES PATENTS

| | | | |
|---|---|---|---|
| 3,022,481 | 2/1962 | Stepoway | 339—75 |
| 3,070,771 | 12/1962 | Piorunneck | 339—174 |
| 3,129,990 | 4/1964 | Rice et al. | 339—17 |

OTHER REFERENCES

Burndy Omaton Division Data Sheet HSSR; August 1963; first page only.

RICHARD E. MOORE, *Primary Examiner.*

PATRICK A. CLIFFORD, *Assistant Examiner.*

U.S. Cl. X.R.

200—133; 339—147